(12) United States Patent
Yeong et al.

(10) Patent No.: US 11,450,733 B2
(45) Date of Patent: Sep. 20, 2022

(54) THREE DIMENSIONAL METAL INSULATOR METAL CAPACITOR STRUCTURE

(71) Applicant: Taiwan Semiconductor Manufacturing Co., Ltd., Hsinchu (TW)

(72) Inventors: Sai-Hooi Yeong, Zhubei (TW); Chia-Ta Yu, New Taipei (TW); Yen-Chieh Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 206 days.

(21) Appl. No.: 16/515,915

(22) Filed: Jul. 18, 2019

(65) Prior Publication Data
US 2021/0020739 A1 Jan. 21, 2021

(51) Int. Cl.
*H01L 49/02* (2006.01)
*H01L 23/31* (2006.01)
*H01L 23/538* (2006.01)
*H01L 23/66* (2006.01)
*H01L 23/00* (2006.01)

(52) U.S. Cl.
CPC .......... *H01L 28/88* (2013.01); *H01L 23/3128* (2013.01); *H01L 23/5383* (2013.01); *H01L 23/5386* (2013.01); *H01L 23/5389* (2013.01); *H01L 23/66* (2013.01); *H01L 24/20* (2013.01); *H01L 2223/6666* (2013.01); *H01L 2224/214* (2013.01); *H01L 2924/19041* (2013.01); *H01L 2924/19105* (2013.01)

(58) Field of Classification Search
CPC ............. H01L 23/5383; H01L 23/5386; H01L 23/5389; H01L 23/66; H01L 24/20; H01L 2223/6666; H01L 2224/214; H01L 2924/19041
See application file for complete search history.

(56) References Cited

U.S. PATENT DOCUMENTS

| | | | |
|---|---|---|---|
| 2008/0153245 A1* | 6/2008 | Lin | H01L 23/5223 438/381 |
| 2011/0143459 A1* | 6/2011 | Yaegashi | H01L 27/11502 438/3 |
| 2011/0165751 A1* | 7/2011 | Choi | H01L 28/90 438/381 |
| 2016/0204190 A1* | 7/2016 | Chu | H01L 23/5226 257/532 |
| 2018/0068978 A1* | 3/2018 | Jeng | H01L 24/02 |
| 2020/0006258 A1* | 1/2020 | Aleksov | H01L 28/40 |

* cited by examiner

*Primary Examiner* — Julia Slutsker
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a 3D metal insulator metal (MIM) capacitor structure with an increased capacitance per unit area in a semiconductor structure. The MIM structure includes a substrate, an oxide layer formed over the substrate, and a first metal layer formed over the oxide layer. The first metal layer includes a plurality of mandrels formed on a surface of the first metal layer. The MIM structure also includes a dielectric layer formed over the first metal layer and the plurality of mandrels, a second metal layer formed over on the dielectric layer, and one or more interconnect structures electrically connected to the first and second metal layers.

20 Claims, 9 Drawing Sheets

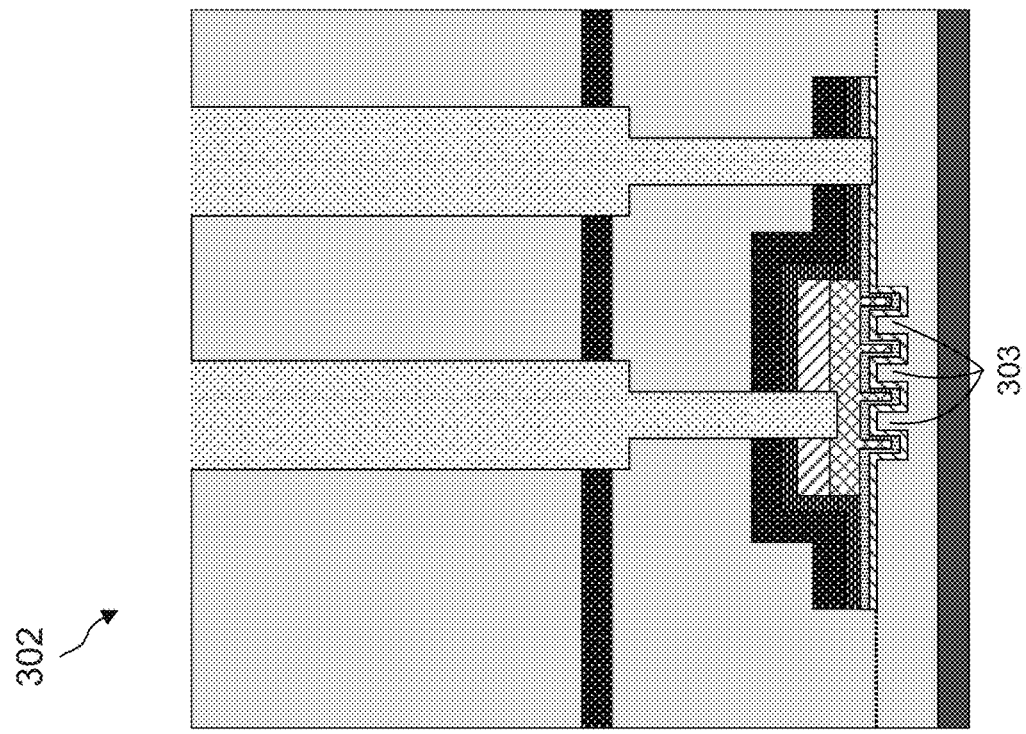
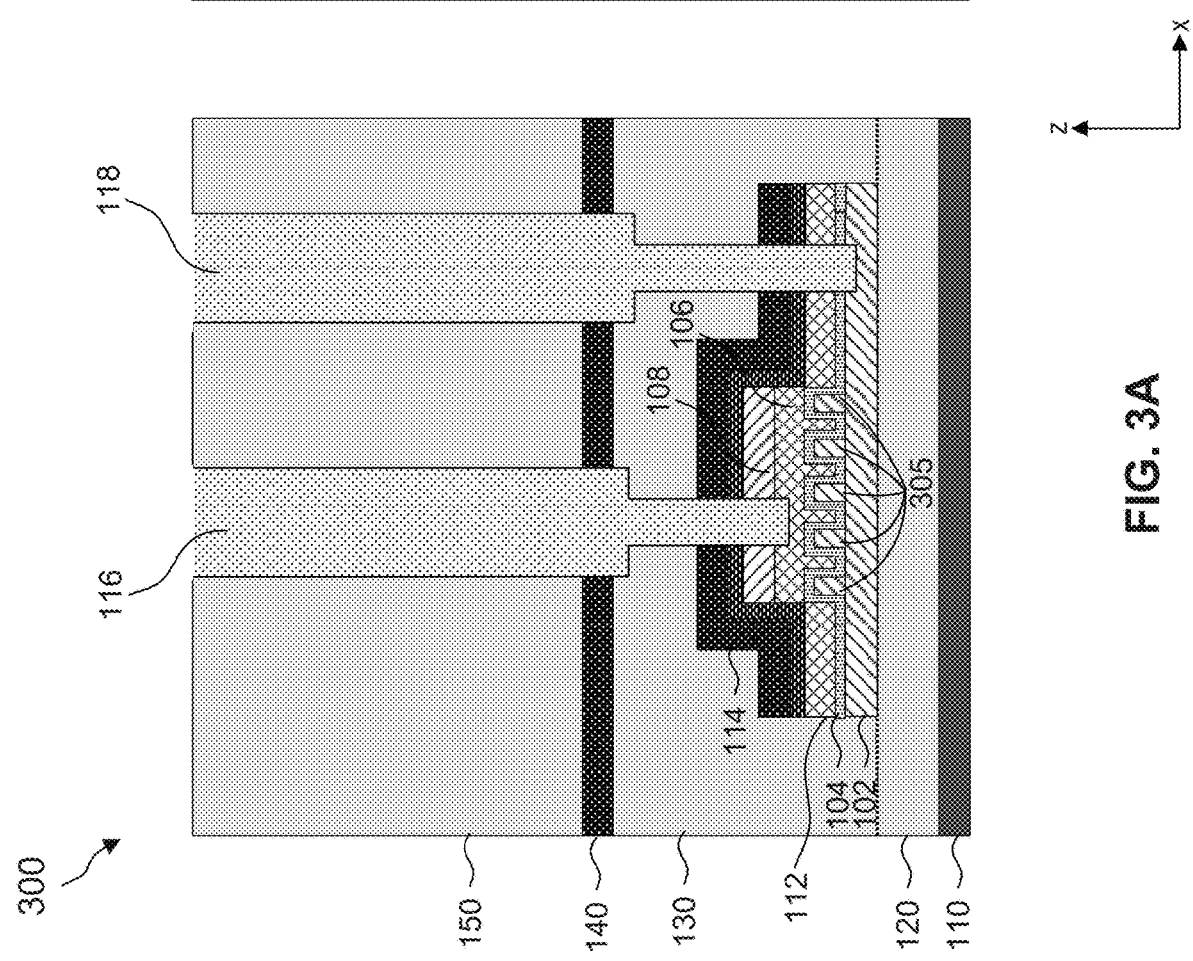

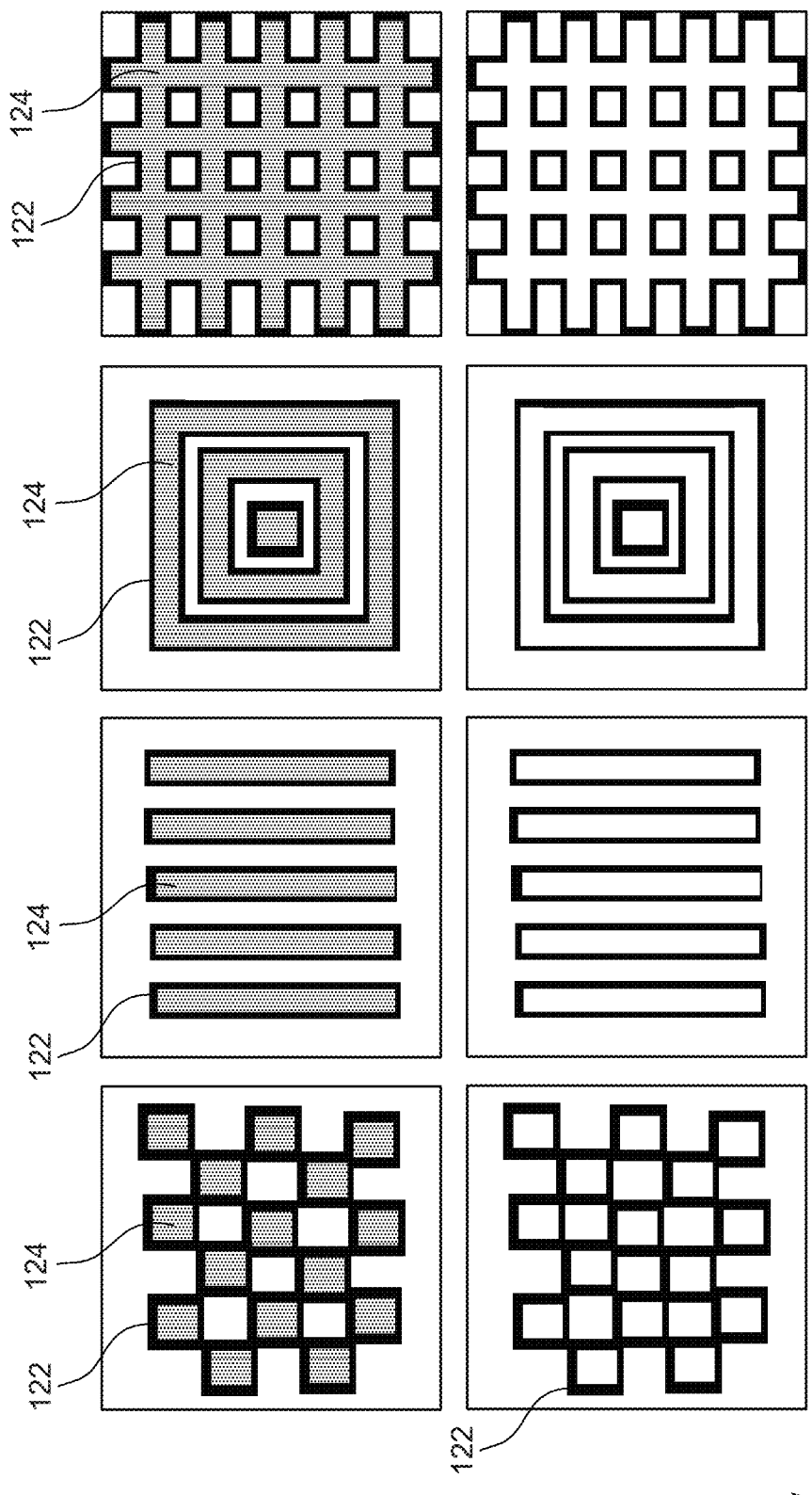

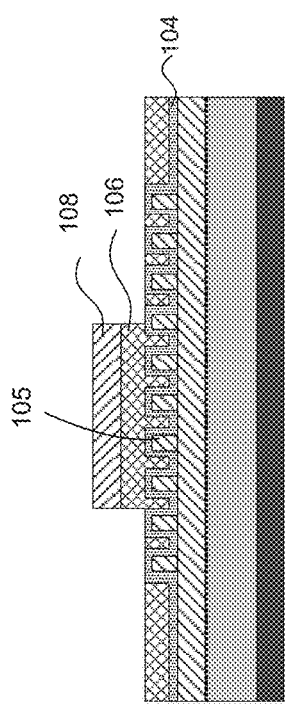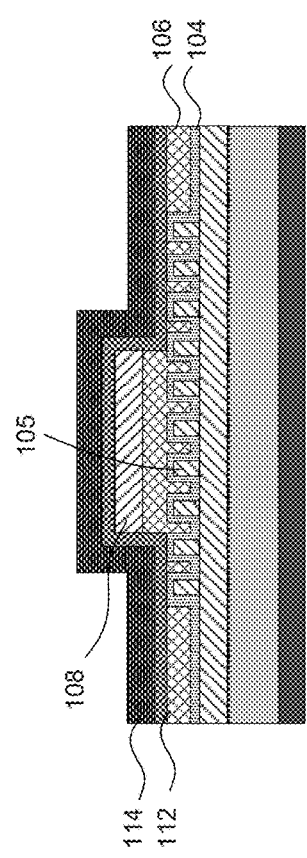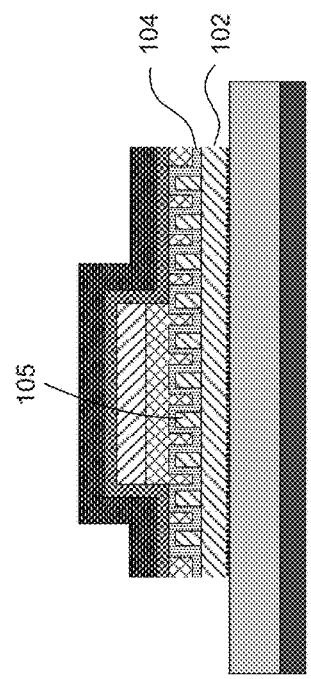

THREE DIMENSIONAL METAL INSULATOR METAL CAPACITOR STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 3A-3B are respective cross-sectional views of other 3D MIM capacitor structures, in accordance with some embodiments.

FIGS. 4A-4D are top-down views of 3D MIM capacitor structures, in accordance with some embodiments.

FIGS. 7A-7I are cross-sectional views of different fabrication stages of a 3D MIM capacitor structure, in accordance with some embodiments.

DETAILED DESCRIPTION

Figure 1:
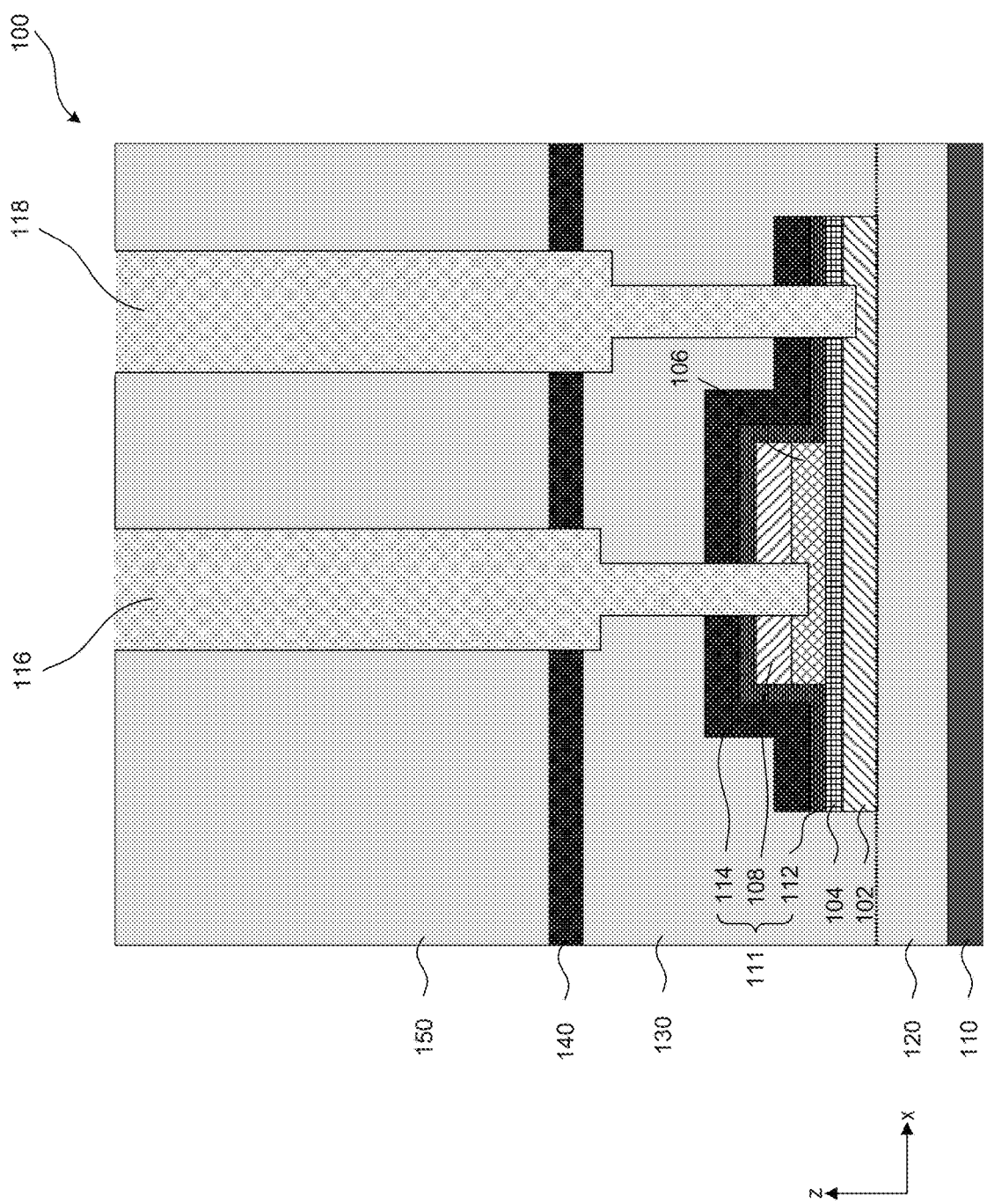
FIG. 1 is a cross-sectional view of a metal-insulator-metal (MIM) capacitor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

In some embodiments, based on the particular technology node, the terms "about" and "substantially" can indicate a value of a given quantity that varies within, for example, ±5% of a target (or intended) value (e.g., ±1%, ±2%, ±3%, ±4%, or ±5% of the value).

Capacitors are elements that are used in semiconductor devices for storing an electrical charge. Capacitors are used in, for example, filters, analog-to-digital converters, memory devices, control applications, decoupling capacitors, and many other types of semiconductor devices. In a chip fabrication process, decoupling capacitors can be built into chips to prevent voltage spikes in a power supply. Integrating the decoupling capacitor into three dimensional (3D) IC package has the benefit of internal interconnects, thus decreasing time delay.

One type of capacitor is a metal-insulator-metal (MIM) capacitor. The MIM capacitor can be formed with two conductive capacitor plates in parallel with a dielectric layer sandwiched therebetween. As technologies progress, integrated circuits are characterized by decreasing dimension requirements over previous generation devices. Dimensions of capacitors are also decreased, which can lead to reduced capacitances. However, in some applications, a higher capacitance is needed to maintain and improve device electrical performance.

Capacitance can be affected by a number of factors, such as the dielectric constant of the dielectric material, the dimensions of the capacitor plates, and the distance separating the capacitor plates. Specifically, capacitance is proportional to the dielectric constant and effective surface area of the capacitor plates, while it is inversely proportional to the separation between the capacitor plates according to the following parallel plate capacitance formula:

$$C = k\varepsilon_o \frac{A}{d}$$

where C is the capacitance of the MIM structure, k is the dielectric constant of the dielectric layer in the MIM structure, $\varepsilon_o$ is the dielectric constant of free space, A is area of the capacitor plates in the MIM structure, and d is the distance between the capacitor plates of the MIM structure (e.g., the thickness of the dielectric layer).For example, a greater dielectric constant or capacitor plate dimension can increase capacitance, while a larger separation between the capacitor plates can reduce capacitance.

Further, adjusting these factors to increase the capacitance may entail a number of problems. For example, increasing the nominal surface area of the capacitor plates on the semiconductor devices may not improve the capacitance per unit area and requires more device space allocated for the capacitor which may be prohibited by the requirements for decreasing device dimension. Increasing effective surface area of the capacitor plates on the semiconductor devices using a trench type MIM may increase the capacitance, however the trench type MIM capacitor may have less uniformity control due to no etch stop layer or have hillocks defect due to process variations. Further, a capacitor with insufficient separation between the parallel capacitor plates can lead to a lower break down voltage for the capacitor.

Various embodiments in accordance with this disclosure provide mechanisms of forming a 3D MIM capacitor structure to increase capacitance per unit area in a semiconductor structure. With an additional mask layer, hard mark mandrels can be formed over a first electrode layer, which can be used to form metal mandrels over the first electrode layer. A high-k dielectric layer and second electrode layer can be deposited over the mandrels and the first electrode layer, thus increasing the effective surface area of the MIM capacitor. In accordance with some embodiments of this disclosure, the 3D MIM capacitor structure includes the following benefits: (i) a higher capacitance per unit area; (ii) better uniformity of the MIM capacitor, (iii) compatibility with current layout design and process flow; and (iv) improved capacitance range in chip designs.

FIG. 1 is a cross-sectional view of a metal-insulator-metal (MIM) capacitor structure 100, in accordance with some embodiments. MIM capacitor structure 100 can include (i) a substrate 110, (ii) an oxide layer 120, (iii) a first capacitor electrode 102, (iv) a dielectric layer 104, (v) a second capacitor electrode 106, (vi) a capping layer 111 including a first capping sublayer 108, a second capping sublayer 112, and a third capping sublayer 114, (vii) a first intermetallic dielectric layer 130, (viii) a hard mask layer 140, (ix) a second intermetallic dielectric layer 150, (x) a first interconnect 118, and (xi) a second interconnect 116. Capacitance of MIM capacitor structure 100 can be determined by a number of parameters, such as dielectric constant of dielectric layer 104, overlap plate dimensions of first capacitor electrode 102 and second capacitor electrode 106, and the capacitor plate separation between them (e.g., the thickness of dielectric layer 104).

Figure 2:
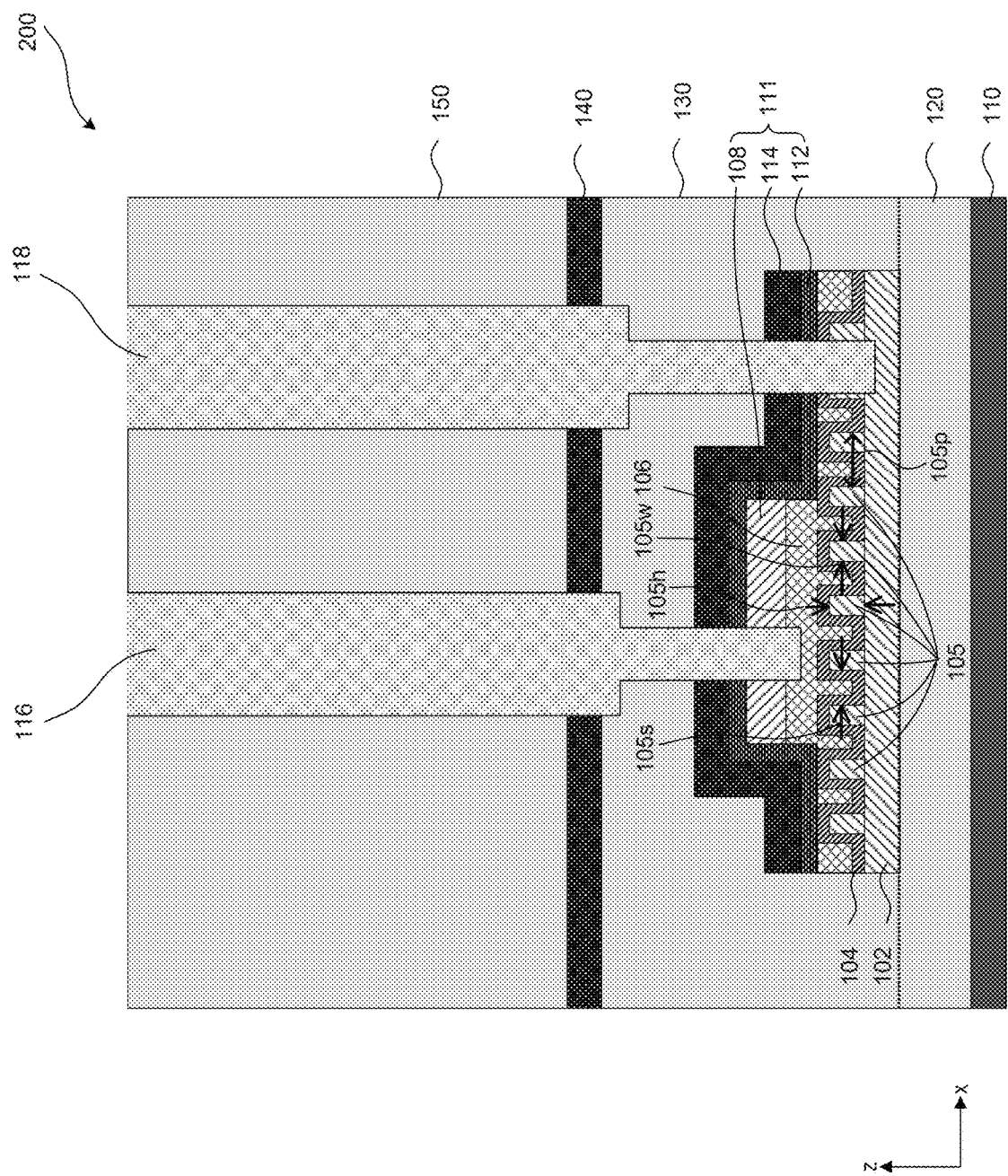
FIG. 2 is a cross-sectional view of a three dimensional (3D) MIM capacitor structure, in accordance with some embodiments.

FIG. 2 is a cross-sectional view of a three dimensional (3D) MIM capacitor structure 200, in accordance with some embodiments. 3D MIM capacitor structure 200 can include (i) a substrate 110, (ii) an oxide layer 120, (iii) a first capacitor electrode 102, (iv) a dielectric layer 104, (v) a plurality of metal mandrels 105, (vi) a second capacitor electrode 106, (vii) a capping layer 111 including a first capping sublayer 108, a second capping sublayer 112, and a third capping sublayer 114, (viii) a first intermetallic dielectric layer 130, (ix) a hard mask layer 140, (x) a second intermetallic dielectric layer 150, (xi) a first interconnect 118, and (xii) a second interconnect 116.

Substrate 110 can be a silicon (Si) substrate, according to some embodiments. In some embodiments, substrate 110 can be (i) another semiconductor, such as germanium (Ge); (ii) a compound semiconductor, such as silicon carbide (SiC); (iii) an alloy semiconductor including silicon germanium (SiGe); or (iv) combinations thereof. In some embodiments, substrate 110 can be a semiconductor on insulator (SOI). In some embodiments, substrate 110 can be an epitaxial material.

Oxide layer 120 can be disposed over substrate 110 to provide isolation between first capacitor electrode 102 and substrate 110, according to some embodiments. Oxide layer 120 can act as a buffer layer for a subsequent metal deposition to reduce hillock defects. Oxide layer 120 can be deposited by plasma enhanced chemical vapor deposition (PECVD), and the thickness of oxide layer 120 can range, for example, from about 20 to about 100 nm. In some embodiments, oxide layer 120 may not be needed if hillock defects can be removed.

First capacitor electrode 102 can be disposed over oxide layer 120. In some embodiments, first capacitor electrode 102 is formed from an aluminum copper alloy, tantalum nitride, aluminum, copper, tungsten, metal silicide, other suitable metal or metal alloys, and/or combinations thereof. In some embodiments, first capacitor electrode 102 can include more than one layer. In some embodiments, the thickness of first capacitor electrode 102 can range from about 20 nm to about 100 nm.

According to some embodiments, with respect to FIG. 2, a plurality of metal mandrels 105 can be disposed over the surface of first capacitor electrode 102. The plurality of metal mandrels 105 can be electrically connected with and be part of first capacitor electrode 102. A height 105$h$ of metal mandrels 105 can range from about 10 nm to 300 nm. If height 105$h$ is larger than 300 nm, metal mandrels 105 can fall and decrease metal mandrel uniformity and capacitance uniformity. If height 105$h$ is smaller than 10 nm, metal mandrels 105 may not increase capacitance of 3D MIM capacitor structure 200 as needed. A space 105$s$ between metal mandrels 105 can range from about 10 nm to 100 nm. And a pitch 105$p$ of metal mandrels 105 can range from about 38 nm to about 100 nm. If space 105$s$ or pitch 105$p$ is larger than 100 nm, metal mandrels 105 may not increase capacitance of 3D MIM capacitor structure 200 as needed. If space 105$s$ or pitch 105$p$ is smaller than 10 nm or 38 nm respectively, dielectric layer 104 may not fill between metal mandrels 105 in subsequent processes. A width 105$w$ of metal mandrels 105 can range, from about 1 nm to about 30 nm. If width 105$w$ is larger than 30 nm, metal mandrels 105 may not increase capacitance of 3D MIM capacitor structure 200 as needed. If width 105$w$ is smaller than 1 nm, metal mandrels 105 may fall and decrease metal mandrel uniformity and capacitance uniformity. The aspect ratio of height 105$h$ to width 105$w$ for metal mandrels 105 can range from about 1 to about 30. If the aspect ratio is larger than 30, metal mandrels 105 can fall and decrease metal mandrel uniformity and capacitance uniformity. If the aspect ratio is smaller than 1, metal mandrels 105 may not increase capacitance of 3D MIM capacitor structure 200 as needed. These dimensions and aspect ratios for plurality of metal mandrels 105 can increase capacitance of 3D MIM capacitor structure 200, improve metal mandrel uniformity and thus capacitance uniformity. First capacitor electrode 102 with plurality of metal mandrels 105 can increase the surface area of first capacitor electrode 102 and the capacitance of 3D MIM capacitor structure 200.

Dielectric layer 104 can be disposed over first capacitor electrode 102 and plurality of metal mandrels 105. Dielectric layer 104 can be made of a high-k dielectric material (e.g., material with a dielectric constant greater than 3.9). The high-k dielectric material can have a dielectric constant between about 3.9 and about 1000 to increase the capacitance of 3D MIM capacitor structure 200. If the dielectric constant is smaller than 3.9, the dielectric material can reduce capacitance of 3D MIM capacitor structure 200. In some embodiments, dielectric layer 104 can be formed of any suitable dielectric material, such as silicon nitride ($SiN_x$), silicon oxide ($SiO_x$), hafnium oxide ($HfO_2$), other suitable dielectric material, and/or combinations thereof.

Dielectric layer 104 can include one or more layers. And the thickness of dielectric layer 104 can range from about 1 nm to about 50 nm.

Second capacitor electrode 106 can be disposed over dielectric layer 104. In some embodiments, second capacitor electrode 106 can be formed using the same material as first capacitor electrode 102. In some embodiments, second capacitor electrode 106 can be formed using a different material. The thickness of second capacitor electrode 106 can range from about 20 nm to about 100 nm.

Capping layer 111 can be disposed over and covers a top surface of second capacitor electrode 106. Capping layer 111 can be used to protect the underlying layers from subsequent fabrication processes. In some embodiments, capping layer 111 can be a hard mask layer. For example, capping layer 111 can be a hard mask layer formed from silicon nitride, silicon oxide, silicon oxynitride, other suitable materials, and/or combinations thereof. In some embodiments, capping layer is formed using a single layer. In some embodiments, capping layer 111 is formed using two or more layers. For example, capping layer 111 can include a first capping sublayer 108, a second capping sublayer 112, and a third capping sublayer 114.

Intermetallic dielectric layers 130 and 150 can each be an insulating layer used to provide electrical insulation between interconnect lines in 3D MIM capacitor structure 200. Intermetallic dielectric layer 130 can be formed over exposed surfaces of first capacitor electrode 102, dielectric layer 104, second capacitor electrode 106, and capping layer 111. In some embodiments, intermetallic dielectric layers 130 and 150 can be formed of silicon oxide, undoped silica glass, fluorinated silica glass, a low-k dielectric material (e.g., material with a dielectric constant less than about 3.9), an extremely low-k dielectric material (e.g., material with a dielectric constant less than about 2.5), other suitable materials, and/or combinations thereof. Thicknesses of intermetallic dielectric layers 130 and 150 can range, for example, from about 500 nm to about 1000 nm. Hard mask layer 140 can be disposed over intermetallic dielectric layer 130 for electrode interconnect patterning. Hard mask layer 140 can be formed of silicon oxynitride, silicon oxide, silicon nitride, other suitable materials, and/or combinations thereof.

First interconnect 118 can be used to provide an electrical connection to first capacitor electrode 102 and can also be used as a metallic interconnect for electrically connecting 3D MIM capacitor structure 200 to external devices or peripheral circuits. First interconnect 118 can be formed in intermetallic dielectric layer 130 and 150. First interconnect 118 can extend into first capacitor electrode 102 to ensure a reliable low resistance electrical contact. In some embodiments, the extension in the z-direction can be greater than about 20 nm to ensure reliable low resistance electrical contact between metals of first interconnect 118 and first capacitor electrode 102. First interconnect 118 can be formed using copper, tungsten, aluminum, other suitable metals, and/or combinations thereof.

Second interconnect 116 can be used to provide an electrical connection to second capacitor electrode 106 and can also be used as a metallic interconnect for electrically connecting 3D MIM capacitor structure 200 to external devices or peripheral circuits. Second interconnect 116 can be formed in intermetallic dielectric layer 130 and 150. Second interconnect 116 can extend into second capacitor electrode 106 to ensure a reliable low resistance electrical contact. In some embodiments, the extension in the z-direction can be greater than about 20 nm for reliable low resistance electrical contact between first interconnect 118 and first capacitor electrode 102. Second interconnect 116 can be formed using a material similar to first interconnect 118.

The effective capacitor plate surface area of MIM capacitor structure 200 in FIG. 2 can be increased without increasing capacitor structure area. According to some embodiments, the capacitance per unit area can be increased by about two to about three times. Moreover, using metal mandrels 105 can improve capacitance uniformity with the mandrel process, which is described below.

FIGS. 3A-3B are respective cross-sectional views of other 3D MIM capacitor structures 300 and 302, in accordance with some embodiments. In contrast to forming metal mandrels on both active area (where second capacitor electrode layer 106 overlaps first capacitor electrode layer 102) and non-active area (where second capacitor electrode layer 106 doesn't overlap first capacitor electrode layer 102) of first capacitor electrode layer 102 in FIG. 2, FIG. 3A shows that metal mandrels 305 can be patterned and formed only in active area of 3D MIM capacitor structure 300, for example, under second capacitor electrode layer 106, according to some embodiments. Non-active areas of 3D MIM capacitor structure 300 may not include metal mandrels 105. This can be realized by patterning hard mask mandrels in FIG. 3B only in active areas. First interconnect 118 can then electrically connect to first capacitor electrode layer 102, as shown in FIG. 3A.

Referring to FIG. 3B, oxide mandrels 303 can be formed instead of metal mandrels 305 in FIG. 3A, in accordance with some embodiments. Oxide mandrels 303 can be formed using a similar process as in FIG. 7B (described below), and first capacitor electrode layer, dielectric layer, and second capacitor electric layer can be deposited over oxide mandrels and oxide layer. 3D MIM capacitor structure 302 deposited over oxide mandrels 303 can have improved capacitance uniformity over trench-type MIM capacitors, as the mandrel process can have good process control of the electrode layers and dielectric layers, while trench process is more susceptible to hillocks defect due to process variations.

FIGS. 4A-4D illustrate top-down views of 3D MIM capacitor structures, according to some embodiments. Top figures of FIGS. 4A-4D show the top-down view of FIG. 7D, and bottom figures of FIGS. 4A-4D show the top-down view of FIG. 7E, according to some embodiments. Metal mandrels 122 can be on the sides of hard mask mandrels 124. After removal of hard mask mandrel 124, metal mandrels 122 remain on the surface of the first capacitor electrode layer. By way of example and not limitation, the top-down views of the metal mandrels are shown as FIGS. 4A-4D. The shapes of metal mandrels 122 from top-down view can be connected rectangles as shown in FIG. 4A, parallel gratings as shown in FIG. 4B, concentric rectangles as shown in FIG. 4C, or separate rectangles as shown in FIG. 4D. In some embodiments, the 3D MIM capacitor structure can include other top-down views, with other shapes, such as a comb shape or a serpentine shape.

Figure 5:
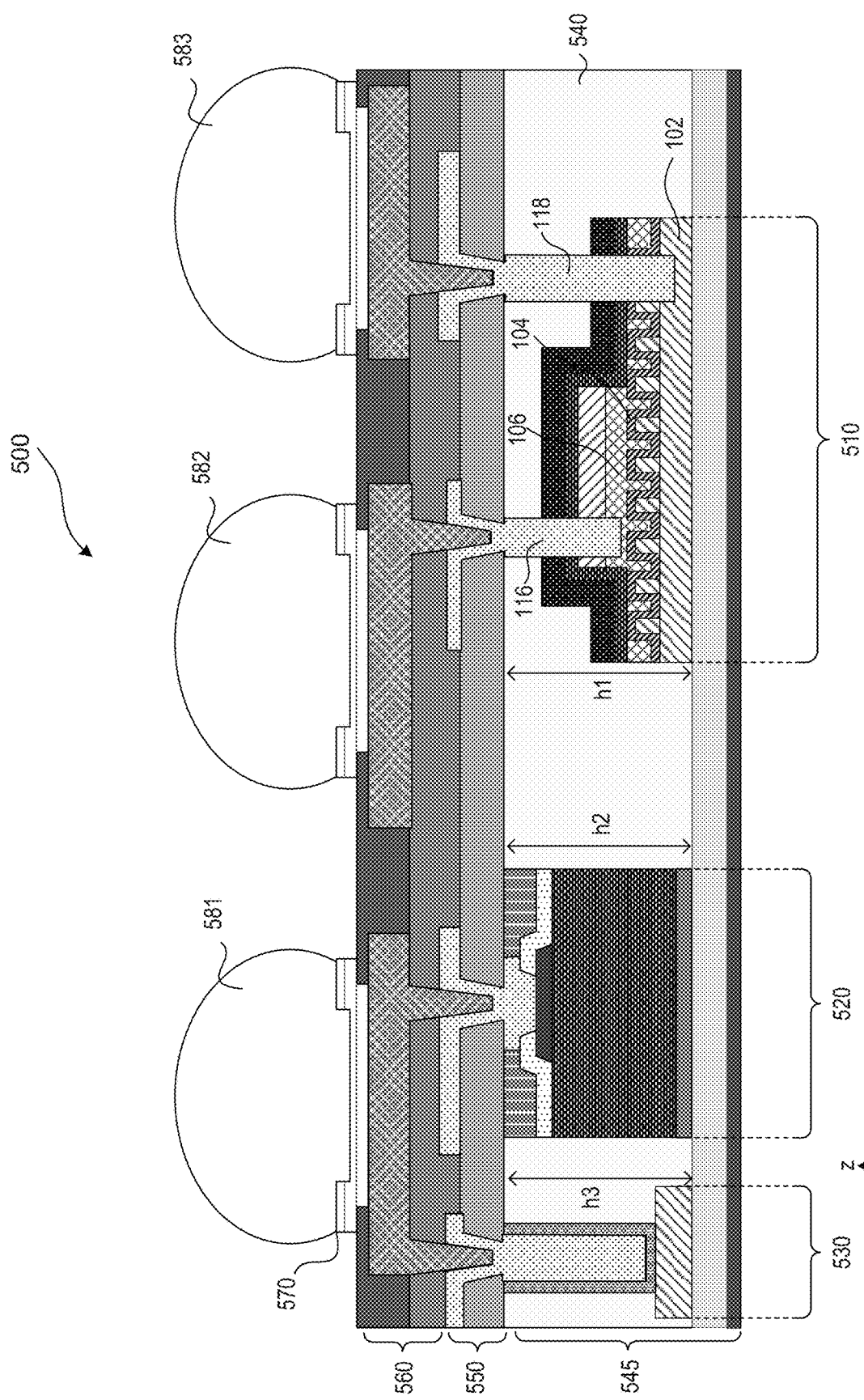
FIG. 5 is a cross-sectional view of an IC package with three dimensional (3D) MIM decoupling capacitor structure, in accordance with some embodiments.

FIG. 5 illustrates a cross-sectional view of an IC package 500 with 3D MIM capacitor structure 510, in accordance with some embodiments. IC package 500 can integrate multiple functional dies, for example, die 520, onto an interposer 545 with a space allocated between each die so that input/output (I/O) connection points can be formed. In some embodiments, 3D MIM capacitor structure 510 can be a decoupling capacitor and formed as part of interposer 545 for IC package 500 to reduce time delay and power consumption. IC package 500 can also include other structures, such as through interposer via (TIV) 530 and molding compound 540. Die 520 may be pre-fabricated using chip fabrication processes and may include a plurality of transistors and multiple interconnect layers configured to implement its functionality (e.g., RF communications). By way of example and not limitation, a height h2 of die 520 may be comparable to a height h3 of TIV 530 and a height h1 of 3D MIM decoupling capacitor 510 with interconnects.

Molding compound 540 can provide structural support to 3D MIM capacitor structure 510, die 520, and TIV 530. A first redistribution layer (RDL) 550 and a second RDL can be formed over 3D MIM capacitor structure 510, die 520, and TIV 530 to electrically connect these structures to peripheral circuits. The number of RDL levels provided herein is exemplary and should not be considered limiting. Therefore, fewer or additional RDL levels may be formed depending on the IC package design. Under bump metallurgy (UBM) contacts 570 and solder bumps 581, 582, and 583 can be formed to electrically connect IC package 500 to external circuits. Solder bumps 581, 582, and 583 can be part of a ball grid array (BGA) and can be made of a metal alloy that may contain tin (Sn), silver (Ag) and copper (Cu), or a metal alloy that may contain lead (Pb) and tin (Sn). The number of solder bumps shown in FIG. 5 is not limiting and, therefore, fewer or additional solder bumps can be possible.

Figure 6:
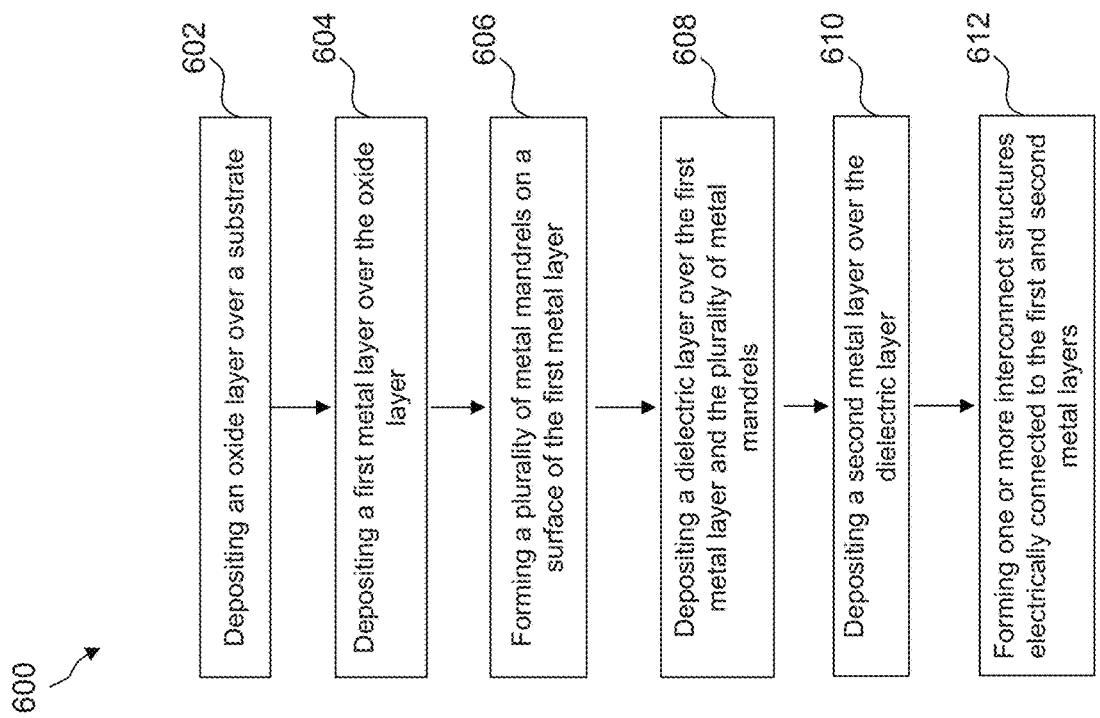
FIG. 6 is a flow diagram of a method for forming a 3D MIM capacitor structure, in accordance with some embodiments.

FIG. 6 describes method 600 for fabricating a 3D MIM capacitor structure, in accordance with some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 6. Operations of method 600 can be performed by, for example, 3D MIM capacitor fabrication process of FIGS. 7A-7I. Operations of method 600 can also be performed by other embodiments discussed in this disclosure. In some implementations, one or more other operations may be performed in addition to or in place of the presently described operations. FIG. 6 will be described in detail with respect to FIG. 7A-7I. The figures provided to describe method 600 are for illustrative purposes only and are not to scale. In addition, the figures may not reflect the actual geometry of the real structures, features, or films.

Figure 7A:
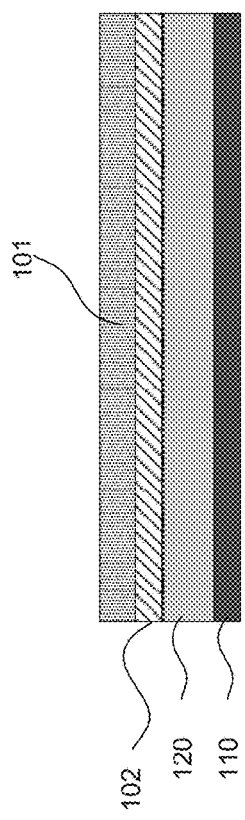

In referring to FIG. 6, method 600 starts with operation 602 by depositing an oxide layer over a substrate, according to some embodiments. FIG. 7A is a cross-sectional view of oxide layer 120 deposited over substrate 110, in accordance with some embodiments. As described above, substrate 110 can be silicon. In some embodiments, substrate 110 can be SiC deposited by chemical vapor deposition (CVD) as a backend of line (BEOL) via etch stop. The thickness of deposited SiC can range, for example, from about 10 nm to about 50 nm. Oxide layer 120 can be deposited by PEVCD over substrate 110 and the thickness can range, for example, from about 20 nm to about 100 nm.

In operation 604, and referring to FIG. 7A, first capacitor electrode metal layer 102 can be deposited over oxide layer 120. In some embodiments, first capacitor electrode layer 102 can be formed of titanium nitride (TiN), aluminum copper alloy (AlCu), aluminum, copper, other suitable materials, and/or combinations thereof. The deposition of first capacitor electrode layer 102 can be done by, for example, physical vapor deposition (PVD). In some embodiments, any suitable processes can be used to form first capacitor electrode layer 102, such as atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof. The deposition process can be performed in a deposition chamber, such as a PVD chamber, at a pressure below about 20 mTorr and at a temperature of about 100° C. The power level used in the deposition process can range from about 1000 W to about 6000 W. In some embodiments, the thickness of first capacitor electrode layer 102 can range from about 20 nm to about 100 nm. For example, first capacitor electrode layer 102 can be a TiN layer with a thickness of about 50 nm.

In FIG. 7A, hard mask layer 101 is deposited over first capacitor electrode metal layer 102, according to some embodiments. Hard mask layer 101 can be formed of silicon oxynitride, silicon oxide, silicon nitride, other suitable materials, and/or combinations thereof. And hard mask layer 101 can be deposited by CVD, ALD, PVD, other suitable methods, and/or combinations thereof. For example, hard mask layer 101 can be a silicon nitride layer deposited by CVD. The thickness of hard mask layer 101 can range, for example, from about 10 nm to about 50 nm.

Figure 7B:
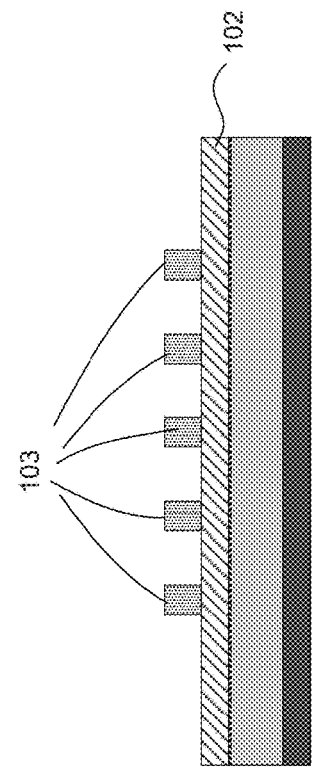

Referring to FIG. 6, method 600 continues with operation 606 by forming a plurality of metal mandrels on a surface of the first metal layer, according to some embodiments. By way of example and not limitation, the plurality of metal mandrels can be formed using processes illustrated in FIGS. 7B-7E. In FIG. 7B, photolithography and etch operations can be processed on hard mask layer 101 to form hard mask mandrels 103. A masking layer can be formed over hard mask layer 101 and patterned to protect regions of hard mask mandrels 103 during the etching process. Composition of the masking layer can include a photoresist, a hard mask, and/or other suitable materials. The patterning process can include forming the masking layer over hard mask layer 101, exposing the resist to a pattern, performing post-exposure bake processes, and developing the resist to form a masking element including the photoresist. The masking element can be used to protect regions of hard mask layer 101 while one or more etching processes sequentially removes exposed hard mask layer 101. First capacitor electrode layer 102 can act as etch stop layer for etching hard mask layer 101. After etching, hard mask mandrels 103 can be patterned on first capacitor electrode layer 102, and first capacitor electrode layer 102 can be exposed where there are no hard mask mandrels 103. According to some embodiments, etch stop layer 102 can improve uniformity of hard mask mandrels 103 and subsequent layers.

Figure 7C:
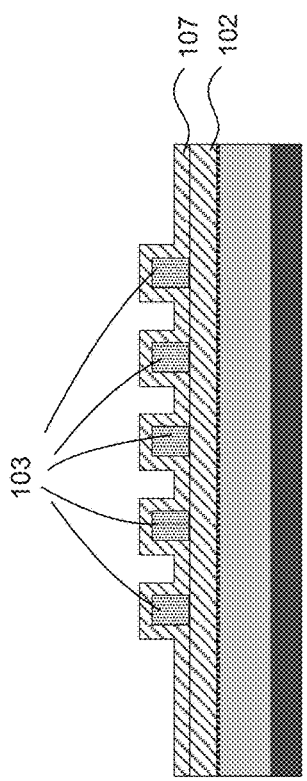

In referring to FIG. 7C, another metal layer 107 is deposited on hard mask mandrels 103 and exposed first capacitor electrode layer 102, according to some embodiments. Metal layer 107 can be deposited by atomic layer deposition (ALD) or other suitable methods. And metal layer 107 can be deposited using the same material as first capacitor electrode layer 102. For example, metal layer 107 can be ALD deposited TiN with better layer uniformity around hard mask mandrels 103. The thickness of metal layer 103 can range, for example, from about 1 nm to about 30 nm.

Figure 7D:
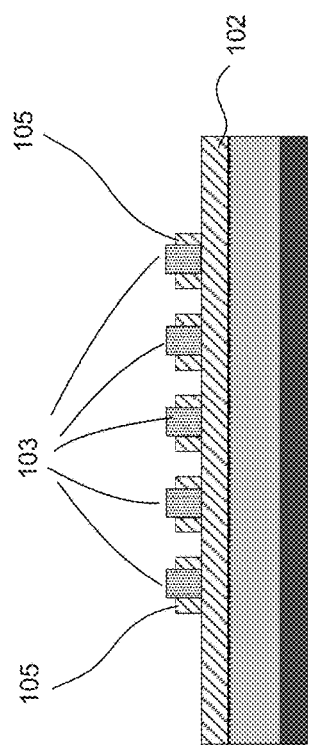
Figure 7E:
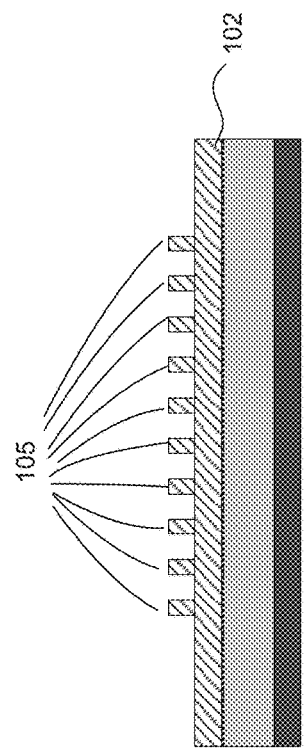

After metal layer 107 is deposited on hard mask mandrels 103 and first capacitor electrode layer 102, metal layer 107 can be etched as shown in FIG. 7D, in accordance with some embodiments. Metal layer 107 can be etched by a chlorine based wet etch, for example, a mix of hydrochloric acid (HCL) and ammonia. Metal layer 107 can also be etched by a fluorine, chlorine or bromine based dry etch, such as a reactive ion etch (RIE) with fluorine, chlorine or bromine based ions (e.g., a mixture of boron chloride and chlorine or a mixture of carbon tetrafluoride and methane) and/or other suitable process. Etching time can depend on metal layer 107 thickness. And etching temperature can range from about 100° C. to about 300° C. During the etching process, hard mask mandrels 103 can act as an etch stop layer for etching metal layer 107. After etching, metal layer 107 is removed from the surface of first capacitor electrode layer 102 and top surface and a portion of side surfaces of hard mask mandrels 103. Metal mandrels 105 on side surfaces of hard mask mandrels 103 remain after the etching. And hard mask mandrels 103 can be removed by a wet etch process as shown in FIG. 7E, according to some embodiments. The wet etch process can be phosphoric acid based process, which may remove mask mandrels 103 and keep metal mandrels 105 and first capacitor electrode layer 102.

Figure 7F:
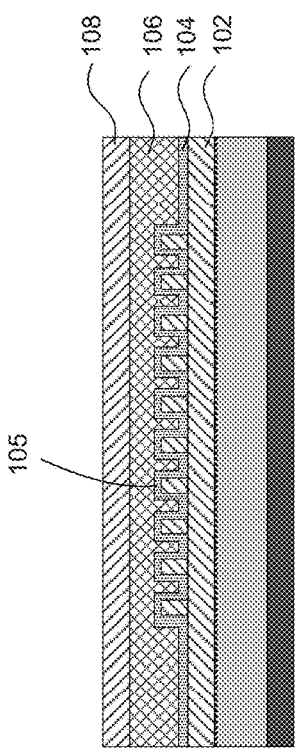

Referring to FIG. 6, method 600 continues with operation 608 by depositing a dielectric layer over the first metal layer and the plurality of metal mandrels, according to some embodiments. FIG. 7F is a cross-sectional view of dielectric layer 104 deposited on first capacitor electrode layer 102 and the plurality of metal mandrels 105, in accordance with some embodiments. By way of example and not limitation, dielectric layer 104 is a high-dielectric constant (high-k) material. And dielectric layer 104 can have a k-value greater than 3.9 (e.g., equal to about 7) depending on the type of material. Dielectric layer 104 can be a silicon nitride ($SiN_x$) film with a k-value of about 7, deposited with a plasma-enhanced chemical vapor deposition (PECVD) process at a deposition temperature of about 180° C. and with a thickness greater than about 30 nm. In addition, dielectric layer 104 can be silicon oxide ($SiO_2$) or silicon oxynitride ($SiON_x$) deposited by, for example, CVD, PECVD, atmospheric pressure CVD (APCVD), sub-atmospheric pressure CVD (SACVD), or MOCVD. In some embodiments, dielectric layer 104 can be a dielectric stack—which may include a bottom layer of zirconium oxide ($ZrO_2$), a middle layer of aluminum oxide ($Al_2O_3$), a top layer of $ZrO_2$—that can be deposited at a temperature of about 210° C. and have a k-value greater than about 13 (e.g., 13.6). In some embodiments, dielectric layer 104 can be a stack that includes hafnium-based dielectrics (e.g., hafnium oxide ($HfO_x$) and hafnium silicate ($HfSiO_x$)), titanium oxide ($TiO_2$), or tantalum oxide ($TaO_x$). Dielectric layer 104 can also be a liquid phase high-k polymer that can be cured and hardened at a temperature below about 250° C. Dielectric layer 104 can also be a spin on glass (SOG) or a liquid phase $SiO_2$ with a low curing temperature (e.g., below about 250° C.) and a k-value between about 4 and about 4.2. Additionally, dielectric layer 104 can be strontium titanium oxide ($SrTiO_3$) with a k-value between 100 and 200, barium-titanium oxide ($BaTiO_3$) with a k-value of about 500, barium-strontium-titanium oxide ($BaSrTiO_3$) with a k-value of between about 500 and 1000, or lead-zirconium-titanium oxide ($PbZrTiO_3$) with a k-value of about 1000.

In operation 610, and referring to FIG. 7F, second capacitor electrode metal layer 106 can be deposited over dielectric layer 104. In accordance with some embodiments, second capacitor electrode layer 106 can be deposited using the same deposition method as first capacitor electrode layer 102. And second capacitor electrode layer 106 can be formed of the material as first capacitor electrode layer 102. For example, second capacitor electrode layer 106 can be a TiN layer deposited by PVD. In some embodiments, the thickness of second capacitor electrode layer 106 can range, for example, from about 20 nm to about 100 nm.

Referring to FIG. 7F, first capping sublayer 108 can be deposited on second capacitor electrode layer 106, in accordance with some embodiments. The deposition of capping material for first capping sublayer 108 can be done by any suitable processes, such as PVD, ALD, CVD, other suitable methods, and/or combinations thereof. First capping sublayer 108 can be a hard mask layer formed of silicon oxynitride deposited by CVD. And the thickness of first capping layer 108 can range from about 10 nm to about 50 nm.

Referring to FIG. 7G, first capping sublayer 108 and second capacitor electrode layer 106 can be patterned to define the second capacitor electrode, in accordance with some embodiments. A masking layer can be formed over first capping sublayer 108 and patterned to protect regions of first capping sublayer 108 and second capacitor electrode layer 106. Composition of the masking layer can include a photoresist, a hard mask, and/or other suitable materials. The patterning process can include forming the masking layer over first capping sublayer 108, exposing the resist to a pattern, performing post-exposure bake processes, and developing the resist to form a masking element including the photoresist. The masking element can be used to protect regions of first capping sublayer 108 while one or more etching processes sequentially removes exposed underlying over first capping sublayer 108 and second capacitor electrode layer 106. Dielectric layer 104 can act as etch stop layer during the patterning of first capacitor electrode.

In FIG. 7H, second capping sublayer 112 and third capping sublayer 114 can be deposited over first capping sublayer 108, exposed dielectric layer 104, and second capacitor electrode layer 106. In some embodiments, second capping sublayer 112 can be a silicon oxide hard mask layer deposited by CVD. And the thickness of second capping layer 112 can range, for example, from about 20 nm to about 100 nm. In some embodiments, third capping sublayer 114 can be a silicon nitride hard mask layer with a thickness between about 10 nm and about 50 nm. In FIG. 3I, an active area of 3D MIM capacitor structure can be patterned and a portion of the non-active area can be etched off, according to some embodiments. The active area of 3D MIM capacitor structure can be defined where second capacitor electrode layer 106 overlaps first capacitor electrode layer 102, for example, the area under second capacitor electrode layer 106. The active area would be the area to calculate the capacitance of the 3D MIM capacitor structure.

Referring to FIG. 6, method 600 continues with operation 612 by forming one or more interconnect structures electrically connected to the first and second metal layers, according to some embodiments. For example, referring to FIG. 2, first interconnect 118 is electrically connected to metal mandrels 105 and first capacitor electrode layer 102, and second interconnect 116 is electrically connected to second capacitor electrode layer 106. First interconnect 118 and second interconnect 116 can also be used to electrically connect 3D MIM capacitor structure 200 to external devices or peripheral circuits. Second capping sublayer 112 and third capping sublayer 114 can mitigate or prevent breakdown between first interconnect 118 and second interconnect 116 at the corner of second electrode layer 106.

Various embodiments in accordance with this disclosure provide mechanisms for forming a 3D MIM capacitor structure to increase capacitance per unit area in a semiconductor structure. Hard mark mandrels can be formed over a first electrode layer, which can be used to form metal mandrels over the first electrode layer. A high-k dielectric layer and a second electrode layer can be deposited over the mandrels and the first electrode layer, thus increasing the effective surface area of the MIM capacitor. In accordance with some embodiments of this disclosure, the 3D MIM capacitor structure has the following benefits: (i) a higher capacitance per unit area; (ii) better uniformity of the MIM capacitor, (iii) compatibility with current layout design and process flow; and (iv) improved capacitance range in chip designs.

In some embodiments, a metal insulator metal (MIM) structure includes a substrate, an oxide layer formed over the substrate, a first metal layer formed over the oxide layer, where the first metal layer includes multiple mandrels formed on a surface of the first metal layer, a dielectric layer formed over the first metal layer and the multiple mandrels, a second metal layer formed over on the dielectric layer, and one or more interconnect structures electrically connected to the first and second metal layers.

In some embodiments, a method includes depositing an oxide layer over a substrate, depositing a first metal layer over the oxide layer, forming multiple metal mandrels on a surface of the first metal layer, depositing a dielectric layer over the first metal layer and the multiple metal mandrels, depositing a second metal layer over the dielectric layer, and forming one or more interconnect structures electrically connected to the first and second metal layers. Forming the multiple metal mandrels further includes depositing a hard mask layer on the surface of the first metal layer, etching the hard mask layer to form multiple hard mask mandrels, depositing a third metal layer over the first metal layer and the multiple hard mask mandrels, etching the third metal layer on the surface of the first metal layer and a top surface and a portion of side surfaces of the multiple hard mask mandrels, and removing the multiple hard mask mandrels.

In some embodiments, a system includes a redistribution layer with solder bumps and an interposer structure electrically connected to the redistribution layer. The interposer structure further includes a capacitor structure, one or more dies over the substrate, and a dielectric layer surrounding the one or more dies and the one or more interconnect structures of the capacitor structure. The capacitor structure further includes a substrate, an oxide layer formed over the substrate, a first metal layer formed over the oxide layer, where the first metal layer includes multiple mandrels on a surface of the first metal layer, a dielectric layer formed over the first metal layer and the multiple mandrels, a second metal layer formed over the dielectric layer, and one or more interconnect structures electrically connected to the first and second metal layers;

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A metal insulator metal (MIM) structure, comprising:
a substrate;
an oxide layer formed over the substrate;
a first metal layer formed over the oxide layer, wherein the first metal layer comprises a plurality of mandrels formed on a surface of the first metal layer;
a dielectric layer formed over the first metal layer and the plurality of mandrels;
a second metal layer formed over on the dielectric layer;
a capping layer formed over the first metal layer, the dielectric layer, and the second metal layer, wherein the dielectric layer is in contact with the plurality of mandrels and the capping layer; and
one or more interconnect structures electrically connected to the first and second metal layers.

2. The MIM structure of claim 1, wherein the first metal layer comprises one or more metal sublayers.

3. The MIM structure of claim 1, wherein the first metal layer comprises titanium nitride.

4. The MIM structure of claim 1, wherein a height of the plurality of mandrels ranges from about 10 nm to about 300 nm.

5. The MIM structure of claim 1, wherein a space between the plurality of mandrels ranges from about 10 nm to about 100 nm.

6. The MIM structure of claim 1, wherein a pitch between the plurality of mandrels ranges from about 38 nm to about 100 nm.

7. The MIM structure of claim 1, wherein the second metal layer is formed over a portion of the plurality of mandrels.

8. The MIM structure of claim 1, further comprising an other dielectric layer surrounding the one or more interconnect structures.

9. The MIM structure of claim 1, wherein a space between the plurality of mandrels is different from an other space between the plurality of mandrels.

10. The MIM structure of claim 1, wherein one of the plurality of mandrels intersects with an other one of the plurality of mandrels from a top-down view.

11. The MIM structure of claim 1, wherein the oxide layer comprises another plurality of mandrels.

12. The MIM structure of claim 1, wherein the plurality f mandrels have an aspect ratio of a height to a width between about 1 and about 30.

13. A system, comprising:
a redistribution layer comprising solder bumps; and
an interposer structure electrically connected to the redistribution layer and comprising:
a capacitor structure comprising:
a substrate;
an oxide layer formed over the substrate;
a first metal layer formed over the oxide layer, wherein the first metal layer comprises a plurality of mandrels on a surface of the first metal layer;
a dielectric layer formed over the first metal layer and the plurality of the mandrels;
a second metal layer formed over the dielectric layer;
a first interconnect structure electrically connected to the first metal layer, wherein the first interconnect structure is in contact with the plurality of mandrels; and
a second interconnect structure electrically connected to the second metal layer;
one or more dies over the substrate; and
an other dielectric layer surrounding the one or more dies and the one or more interconnect structures of the capacitor structure.

14. The system of claim 13, wherein the second metal layer is formed over a portion of the plurality of mandrels.

15. The system of claim 13, wherein an aspect ratio of the plurality of mandrels ranges from about 1 to about 30, the aspect ratio being a ratio of a height to a width of the plurality of mandrels.

16. A semiconductor structure, comprising:
a capacitor structure formed over a substrate, wherein the capacitor structure comprises:
   a first metal layer on an oxide layer and comprising a first plurality of mandrels on a surface of the first metal layer;
   a dielectric layer on the first metal layer and the first plurality of the mandrels; and
   a second metal layer on the dielectric layer, wherein the second metal layer comprises a second plurality of mandrels between the first plurality of mandrels;
a capping layer formed over the capacitor structure and in contact with the second plurality of mandrels;
a first interconnect structure electrically connected to the first metal layer;
a second interconnect structure electrically connected to the second metal layer; and
an intermetallic dielectric layer formed over the capacitor structure and the capping layer, wherein the intermetallic dielectric separates the first and second interconnect structures.

17. The semiconductor structure of claim 16, wherein the second metal layer is formed over a portion of the first plurality of mandrels.

18. The semiconductor structure of claim 16, wherein an aspect ratio of the first plurality of mandrels ranges from about 1 to about 30, the aspect ratio being a ratio of a height to a width of the first plurality of mandrels.

19. The semiconductor structure of claim 16, wherein the capping layer comprises a first capping sublayer on the second metal layer, a second capping sublayer on the first capping sublayer and the dielectric layer, and a third capping sublayer on the second capping sublayer.

20. The semiconductor structure of claim 16, wherein the dielectric layer comprises a high-k dielectric material.

* * * * *